United States Patent
Ham

Patent Number: 5,977,595
Date of Patent: Nov. 2, 1999

[54] APPARATUS AND METHOD FOR ELECTROSTATIC DISCHARGE PROTECTION WITH IMPROVED CURRENT DISPERSION

[75] Inventor: Seog-heon Ham, Seoul, Rep. of Korea

[73] Assignee: Samsung Electronics, Co., Ltd., Suwon, Rep. of Korea

[21] Appl. No.: 08/878,483

[22] Filed: Jun. 18, 1997

[30] Foreign Application Priority Data

Jun. 27, 1996 [KR]  Rep. of Korea ................. 96-24426

[51] Int. Cl.[6] .................................................. H01L 23/62
[52] U.S. Cl. .......................... 257/358; 257/360; 257/363; 257/365
[58] Field of Search ................................. 257/355, 356, 257/357, 358, 360, 363, 365, 341, 401, 775

[56] References Cited

U.S. PATENT DOCUMENTS

H842 11/1990 Ochs ........................................ 257/767

Primary Examiner—Valencia Martin-Wallace
Assistant Examiner—George C. Eckert, II
Attorney, Agent, or Firm—Marger Johnson & Mccollom, P.C.

[57] ABSTRACT

The present invention relates to an apparatus and method for protecting a semiconductor device, and more particularly to an n-type metal-oxide semiconductor (NMOS) transistor with a ladder structure, used for protecting a semiconductor device from electrostatic discharge. In the present invention, a plurality of drain branches are connected by resistors, and a contact point of the well and the source/well pattern is formed only alongside the drain branch of the ladder structure which is nearest an input/output terminal of the semiconductor device. Accordingly, the current is better dispersed to all of the drain branches, thereby preventing the voltage breakdown of the transistor due to heat caused by the localization of current in the drain branch farthest from the input/output terminal.

10 Claims, 1 Drawing Sheet

APPARATUS AND METHOD FOR ELECTROSTATIC DISCHARGE PROTECTION WITH IMPROVED CURRENT DISPERSION

BACKGROUND OF THE INVENTION

1. Field of the Invention

The present invention relates to a device and method for protecting a semiconductor device, and more particularly, to an n-type metal-oxide semiconductor (NMOS) transistor having a ladder structure, used as a device for protecting a semiconductor device.

2. Description of the Related Art

Semiconductor devices often include an input/output protection circuit to protect internal circuits of the semiconductor device against high voltages, such as the voltages caused by electrostatic discharge (ESD), which can be inadvertently applied to an input terminal or an output terminal of the internal circuits. Conventional protection devices employ a diode, a resistor or a transistor to protect the internal circuits of the semiconductor device. Among these devices, the transistor, typically, an n-type metal-oxide semiconductor (NMOS) transistor, has the disadvantage that the leakage current is large compared to the diode. However, the NMOS transistor is typically used for a complementary MOS (CMOS) circuit because the protection characteristics, such as trigger voltage, snap-back voltage and dynamic resistance, are excellent as compared to the other devices.

A typical NMOS transistor structure consists of a p-type substrate or well, n$^+$-type source and drain regions, and a gate formed on the p-type substrate. When an NMOS transistor is used as a protection device, the transistor's gate, the well and the source are grounded and the drain is connected to the pad of either an input or output terminal.

The protection level of the NMOS transistor is greatly influenced by the width of the gate. Generally, the wider the gate, the better the protection level. However, the width of the gate often cannot be increased in one dimension because of size or layout limitations of the semiconductor chip. When the gate size is limited in one dimension, a ladder or finger structure is typically used to increase the gate area.

FIG. 1 is a layout of a conventional MOS transistor with a ladder structure.

First, a gate pattern 1 is formed consisting of a main line and several gate branches G which branch out perpendicularly from the main line of the gate pattern 1.

Next, a drain pattern 3 is formed consisting of a main line and several drain branches D which branch out perpendicularly from the main line of drain pattern 3.

Finally, a source/well pattern 2 is formed consisting of a source/well main line and a pair of source branches S and a pair of source/well branches S/W branching perpendicularly from the source/well main line where the pair of source branches S lie within an area between the pair of source/well branches S/W.

The main lines of patterns 1, 2 and 3 are parallel to each other with the drain main line lying to one side of the gate main line and the source/well main line lying to the other side of the main line.

The source, source/well, gate and drain regions of patterns 1, 2 and 3 are also parallel to one another with each drain branch D being on one side of a gate branch G and either a source branch S or a source/well region being on the other side.

In addition, the gate branches G and drain branches D extend outward from their respective main lines in the same direction while the source branches S and pair of source/well branches S/W extend outward from the main line of pattern 2 in the opposite direction.

The source branch S and drain branch D are connected to an n-type region 40 of a semiconductor substrate through several source contact holes 10 and drain contact holes 30, respectively. The source/well branches S/W, positioned at each end of the transistor, are connected to a p-type region 50, which is typically a well region of the semiconductor substrate through well contact holes 20, and to the n-type region 40 through source contact holes 10. In addition, the main line of the source/well pattern 2 is connected to the p-type region 50 through well contact holes 20. As a result, the MOS transistor formed by the ladder structure is surrounded by source contact holes 10 and well contact holes 20.

Finally, the drain pattern 3 is connected either to an input or output terminal and the source pattern 2 is grounded.

However, the conventional ladder structure described above has the disadvantage that the electrostatic protection level is reduced because of the low voltage breakdown of the device caused by current localization.

Current localization occurs because there is a difference between the resistance values due to the difference in distance between the well contact holes 20 and the source contact holes 10. The farther a source region is from a well contact hole 20, the greater will be the value of the resistance between the source region and the well area 50. The source region which is farthest from a well contact hole 20 is turned ON first when a positive static electric charge is applied to the drain when the source and well are grounded. The discharge rate of the device deteriorates since the current is localized toward the drain region D which is nearest to the turned ON source region, when the source is forward biased.

SUMMARY OF THE INVENTION

Accordingly, the object of the present invention is to prevent voltage breakdown in an electrostatic protection device due to heat build-up by reducing current localization phenomenon.

To achieve the objects and in accordance with the purpose of the invention, as embodied and broadly described herein, an embodiment of an electrostatic protection transistor according to the present invention includes a semiconductor substrate having a well region, a source active region and a drain active region. A plurality of gate branches are formed independently of one another on the semiconductor substrate and disposed substantially parallel to one another such that each one of the plurality of gate branches has a first and second side wherein the first side is opposite to the second side. A source contact is also formed on the semiconductor substrate which has a pattern which includes a source main line and a plurality of source branches, wherein each one of the plurality of source branches is disposed substantially perpendicular to the source main line, and further wherein each one of the plurality of source branches is further disposed along the first side of a corresponding one of the plurality of gate branches, and still further wherein each one of the plurality of source branches is connected to the source active region. A plurality of drain branches are formed independently of one another on the semiconductor substrate and disposed substantially parallel to one another, wherein each one of the plurality of drain branches corresponds to one of the plurality of gate branches, and further wherein each one of the plurality of drain branches is disposed along the second side of the corresponding one of the plurality of gate branches, and still further wherein each one of the plurality of drain branches is connected to the drain active region. The transistor also includes a plurality of resistors wherein each one of the plurality of resistors corresponds to a pair of adjacent drain branches and is coupled between the pair of adjacent drain branches. Also, one of the plurality of source branches of the transistor is further connected to the well region.

An embodiment of the method for dispersing current in an electrostatic protection transistor, according to the present invention, involves disposing a gate contact having a plurality of gate branches over a semiconductor substrate, diffusing source and drain active areas into the semiconductor substrate, and disposing a source contact having a plurality of source branches over the source active areas, such that the source branches are adjacent the gate branches. The source branches are then coupled to the source active areas. The method further involves disposing a plurality of drain branches over the drain active areas, such that the drain branches are adjacent the gate branches, coupling the drain branches to the drain active areas, and coupling the plurality of drain branches to one another with resistors. Also, the method includes forming an input/output terminal on the semiconductor substrate and coupling the source branch closest to the input/output terminal to a well in the semiconductor substrate.

Here, it is preferable that the drain branches be connected to an input/output terminal of a semiconductor device, and the source/well pattern be grounded. In addition, it is preferable that a contact point of the source/well pattern and the well be formed in only the direction of the drain branches which are near to the input/output terminal of the semiconductor device.

As described above, the localization of the current is prevented since the current, which flows when an electrostatic charge is introduced at the input/output terminal, is limited in the source region farthest from the well contact point and the source/well pattern.

Additional objects and advantages of the invention are set forth in part in the description which follows, and in part will be obvious from the description, or may be learned by practice of the invention. The objects and advantages of the invention will be realized and attained by means of the elements and combinations particularly pointed out in the appended claims.

BRIEF DESCRIPTION OF THE DRAWINGS

The accompanying drawings illustrate one embodiment of the invention and, together with the description, serve to explain the principles of the invention.

In the drawings.

DETAILED DESCRIPTION OF THE INVENTION

Figure 2:
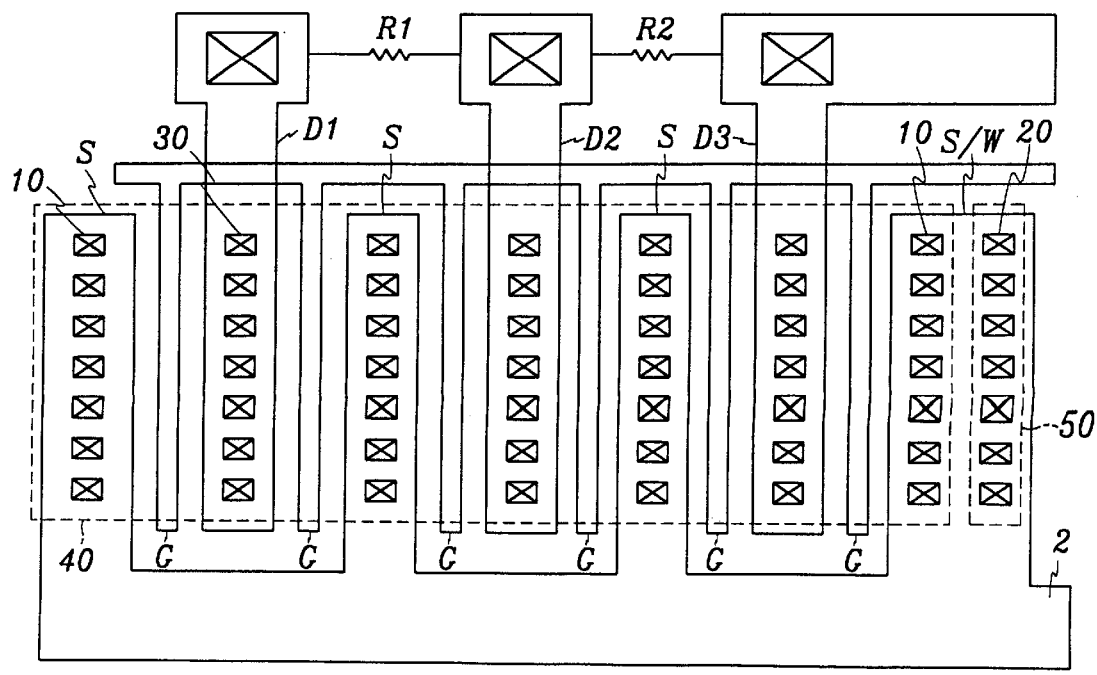
FIG. 2 is a layout of an MOS transistor with a ladder structure according to an embodiment of the present invention.

Reference will now be made in detail to a preferred embodiment of the present invention, an example of which is illustrated in FIG. 2.

Figure 1:
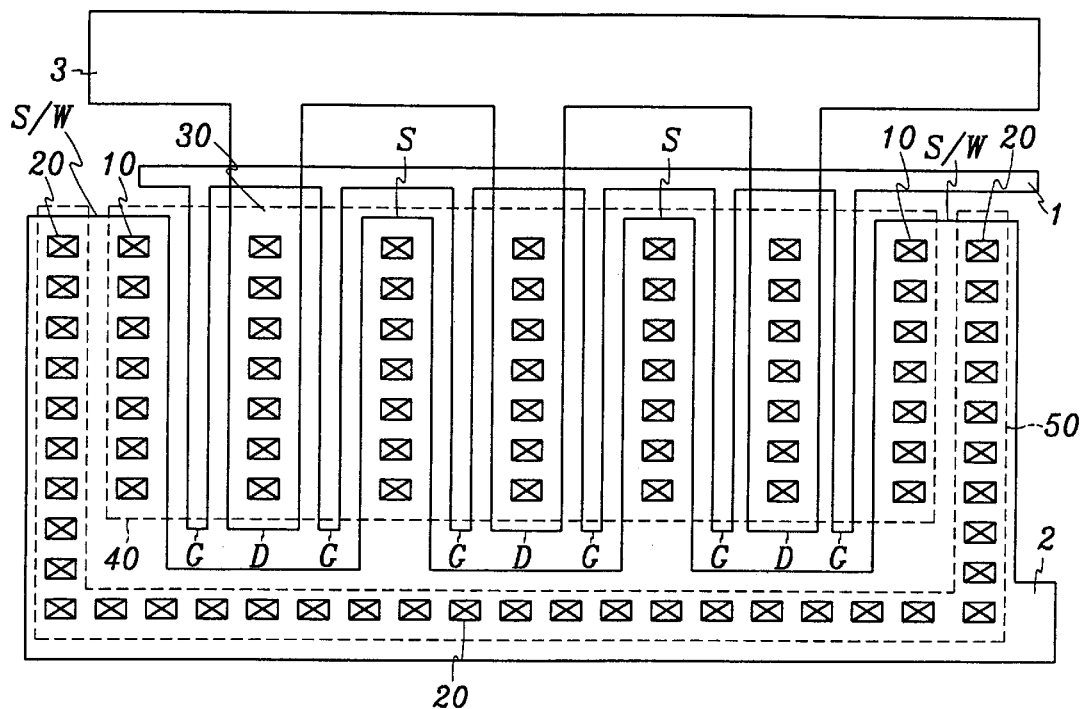
FIG. 1 is a layout of a conventional MOS transistor with a ladder structure.

Referring to FIG. 2, the differences between the conventional NMOS transistor of FIG. 1 and the NMOS transistor according to the present invention of FIG. 2 are as follows.

First, a source branch S is formed at one end of the transistor near drain region D1 and only one source/well branch S/W is formed at the other end of the transistor, in the direction of a drain branch D3, which is the end nearest to an input or output terminal, in the preferred embodiment of the present invention.

The well contact holes 20, which are connected to the p-type well 50 of the semiconductor substrate, are formed along the outside edge of the source/well branch S/W. The p-type well 50 is formed under the well contact hole 20, but is not formed under the main line of source/well pattern 2.

In addition, a resistor R1 is formed between drain branches D1 and D2, and a resistor R2 is formed between drain branches D2 and D3.

The operation of the device for protecting a semiconductor device according to the present invention will now be explained.

Current flows in drain branch D1, which is farthest away from a well contact hole 20, as described above, when the current flows from the input/output terminal (not shown) connected to the drain branch D3. The current flowing in from the input/output terminal is dispersed since resistors R1 and R2 limit the amount of current flowing to drain branch D1 and resistor R2 limits the amount of current flowing to drain branch D2. As a consequence, more current flows in drain branch D3 since there is no resistor to limit the current flow.

As described above, the device is prevented from voltage breakdown by dispersing the current before the current is localized by forming resistors between the drain branches and forming well contact holes alongside the drain branch which is nearest the input or output terminal of the semiconductor device.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. An electrostatic protection transistor, the transistor comprising:

a semiconductor substrate having a well region having a first dopant type and wherein the well region is selectively diffused with a second dopant type to form a plurality of source active regions and drain active regions formed within the well region;

a gate contact having a plurality of gate branches formed independently of one another on the semiconductor substrate and disposed substantially parallel to one another such that each one of the plurality of gate branches has a first and second side wherein the first side is opposite to the second side;

a source contact formed on the semiconductor substrate and having a pattern which includes a source main line and a plurality of source branches, wherein each one of the plurality of source branches is disposed substantially perpendicular to the source main line, and further wherein each one of the plurality of source branches is further disposed along the first side of a corresponding one of the plurality of gate branches, and still further wherein each one of the plurality of source branches is connected to one of the source active regions;

a plurality of drain branches formed independently of one another on the semiconductor substrate and disposed substantially parallel to one another, wherein each one of the plurality of drain branches corresponds to one of the plurality of gate branches, and further wherein each one of the plurality of drain branches is disposed along the second side of the corresponding one of the plurality of gate branches, and still further wherein each one of the plurality of drain branches is connected to one of the drain active regions;

a plurality of resistors wherein each one of the plurality of resistors corresponds to a pair of adjacent drain branches and is coupled between the pair of adjacent drain branches; and wherein one of the plurality of source branches is further connected to the well region.

2. The transistor of claim 1, wherein one of the plurality of drain branches is configured to be coupled to an input/output terminal of a semiconductor device.

3. The transistor of claim 2, the transistor further including a contact between one of the source branches and the well formed parallel to an adjacent drain branch.

4. The transistor of claim 3, wherein the source branch connected to the well is disposed near to the input/output terminal of the semiconductor device.

5. The transistor of claim 4, wherein the source branch connected to the well is closer to the input/output terminal of the semiconductor device than any other one of the plurality of source branches.

6. A method for dispersing current in an electrostatic protection transistor, the method comprising the steps:

disposing a gate contact having a plurality of gate branches over a semiconductor substrate;

diffusing source and drain active areas into the semiconductor substrate;

disposing a source contact having a plurality of source branches over the source active areas, such that the source branches are adjacent the gate branches;

coupling the source branches to the source active areas;

disposing a plurality of drain branches over the drain active areas, such that the drain branches are adjacent the gate branches;

coupling the drain branches to the drain active areas;

coupling the plurality of drain branches to one another with resistors;

selecting one of the source branches to be closest to an input/output terminal on the semiconductor substrate;

coupling the source branch selected to be closest to the input/output terminal to a well in the semiconductor substrate.

7. The method of claim 6, wherein the step of coupling the source branch closest to the input/output terminal to a well in the semiconductor substrate includes the step of disposing a contact region connecting the source branch selected to be closest to the input/output terminal to the well adjacent to a lengthwise axis of the source branch which is parallel to a lengthwise axis of an adjacent drain branch the step of coupling the source branch closest to the input/output terminal to a well in the semiconductor substrate includes the step of disposing a contact region connecting the source branch selected to be closest to the input/output terminal to the well adjacent to a lengthwise axis of the source branch which is parallel to a lengthwise axis of an adjacent drain branch.

8. The method of claim 6, further including the steps:

coupling the drain branches to the input/output terminal; and coupling the source contact to a ground potential.

9. An electrostatic protection device for a semiconductor device having an input/output terminal, the electrostatic protection device comprising:

a p-type well region;

a plurality of n-type source active regions formed within the p-type well region;

a plurality of n-type drain active regions formed within the p-type well region;

a gate contact having a plurality of gate branches, the gate branches being disposed upon the p-type well region and between the source active regions and drain active regions;

a source contact having a plurality of source branches, each source branch being disposed upon and connected to one of the source active regions, and each source branch being further disposed adjacent to one of the gate branches, and wherein the source contact is coupled to a ground potential;

a plurality of independently formed drain branches, each drain branch being disposed upon and connected to one of the drain active regions, and each drain branch being further disposed adjacent to one of the gate branches, and wherein the plurality of drain branches is coupled to the input/output terminal;

a plurality of resistors, each resistor being disposed between an adjacent pair of drain branches;

wherein a one of the plurality of source branches which is closest to the input/output terminal is coupled to the p-type well region.

10. The electrostatic protection device of claim 9, wherein:

each of the plurality of gate branches is formed with a lengthwise axis, wherein the lengthwise axis of each gate branch is parallel to the lengthwise axis of each other gate branch;

each of the plurality of source branches is formed with a lengthwise axis, wherein the lengthwise axis of each source branch is parallel to the lengthwise axis of each other source branch and the lengthwise axis of each gate branch;

each of the plurality of drain branches is formed with a lengthwise axis, wherein the lengthwise axis of each drain branch is parallel to the lengthwise axis of each other drain branch and the lengthwise axis of each gate branch and each source branch; and wherein the source branch coupled to the p-type well region is connected to the p-type well region along an axis parallel to the lengthwise axis of the source branch.

* * * * *